(12) United States Patent
Jou et al.

(10) Patent No.: US 10,545,300 B2
(45) Date of Patent: Jan. 28, 2020

(54) THREE-DIMENSIONAL WDM WITH 1×M OUTPUT PORTS ON SOI BASED STRAIGHT WAVEGUIDES COMBINED WITH WAVELENGTH FILTERS ON 45 DEGREE REFLECTORS

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/963,780

(22) Filed: Apr. 26, 2018

(65) Prior Publication Data

US 2018/0335589 A1 Nov. 22, 2018

Related U.S. Application Data

(60) Provisional application No. 62/508,940, filed on May 19, 2017, provisional application No. 62/509,892, filed on May 23, 2017.

(51) Int. Cl.
*G02B 6/42* (2006.01)
*G02B 6/12* (2006.01)
(Continued)

(52) U.S. Cl.
CPC ........ *G02B 6/4214* (2013.01); *G02B 6/12011* (2013.01); *G02B 6/3652* (2013.01);
(Continued)

(58) Field of Classification Search
CPC ... G02B 6/4214; G02B 6/4259; G02B 6/4279
(Continued)

(56) References Cited

U.S. PATENT DOCUMENTS

| 5,282,080 A | 1/1994 | Scifres et al. |
| 5,416,861 A | 5/1995 | Koh et al. |

(Continued)

FOREIGN PATENT DOCUMENTS

| WO | WO 2018/213035 A1 | 11/2018 |
| WO | WO 2018/213036 A1 | 11/2018 |

(Continued)

OTHER PUBLICATIONS

WIPO Application No. PCT/US2018/031332, PCT International Search Report and Written Opinion of the International Searching Authority dated Jul. 26, 2018.

(Continued)

*Primary Examiner* — Akm E Ullah
(74) *Attorney, Agent, or Firm* — Alston & Bird LLP

(57) ABSTRACT

An optical WDM device on a substrate and a fabrication method are disclosed. The WDM device includes a broadband light source, multiple output optical receivers, and a silicon waveguide terminated with two end reflectors, and a number of sequentially arranged WDM splitters between the two end reflectors. Each of the WDM splitters has a front and rear reflectors. The first end reflector is broadband coated to input light into the waveguide. The front reflectors of the WDM splitters and the second end reflector are narrowband coated so each reflector only selects to reflect one of the wavelengths from the light source. The rear reflectors of the WDM splitters are anti-reflection coated in order to transmit the unselected light to the next stage WDM splitter. The first end reflector is aligned to the input source, the WDM splitters and the second end reflector each are sequentially aligned to the output receivers.

20 Claims, 12 Drawing Sheets

(51) Int. Cl.

| | |
|---|---|
| *H04B 10/25* | (2013.01) |
| *H04B 10/50* | (2013.01) |
| *H04B 10/67* | (2013.01) |
| *H04J 14/02* | (2006.01) |
| *G02B 6/36* | (2006.01) |

(52) U.S. Cl.
CPC ........... *G02B 6/425* (2013.01); *G02B 6/4206* (2013.01); *G02B 6/428* (2013.01); *G02B 6/4212* (2013.01); *G02B 6/4259* (2013.01); *G02B 6/4279* (2013.01); *H04B 10/25* (2013.01); *H04B 10/506* (2013.01); *H04B 10/67* (2013.01); *H04J 14/02* (2013.01); *H05K 2201/10121* (2013.01)

(58) Field of Classification Search
USPC .......................................................... 385/14
See application file for complete search history.

(56) References Cited

U.S. PATENT DOCUMENTS

| | | | |
|---|---|---|---|
| 5,446,814 A | 8/1995 | Kuo et al. | |
| 5,485,021 A | 1/1996 | Abe | |
| 5,956,603 A * | 9/1999 | Talwar | H01L 21/26513 |
| | | | 438/520 |
| 6,036,956 A | 3/2000 | Jacob et al. | |
| 6,049,639 A | 4/2000 | Paniccia et al. | |
| 6,052,498 A | 4/2000 | Paniccia | |
| 6,243,508 B1 | 6/2001 | Jewell et al. | |
| 6,330,377 B1 | 12/2001 | Kosemura | |
| 6,393,169 B1 | 5/2002 | Paniccia et al. | |
| 6,403,393 B1 | 6/2002 | Adkisson et al. | |
| 6,456,765 B1 | 9/2002 | Klocek et al. | |
| 6,549,708 B2 | 4/2003 | Worchesky et al. | |
| 6,587,605 B2 | 7/2003 | Paniccia et al. | |
| 6,603,915 B2 | 8/2003 | Glebov et al. | |
| 6,731,856 B1 * | 5/2004 | Fujita | G02B 6/1221 |
| | | | 385/129 |
| 6,845,184 B1 | 1/2005 | Yoshimura et al. | |
| 6,996,303 B2 | 2/2006 | Glebov et al. | |
| 7,218,809 B2 | 5/2007 | Zhou et al. | |
| 7,266,262 B2 | 9/2007 | Ogawa | |
| 7,529,439 B2 | 5/2009 | Kim et al. | |
| 7,627,204 B1 | 12/2009 | Deane | |
| 8,135,248 B2 | 3/2012 | Hodono | |
| 8,368,995 B2 * | 2/2013 | Dallesasse | H01S 5/021 |
| | | | 359/279 |
| 9,036,956 B2 | 5/2015 | Tseng et al. | |
| 9,086,551 B2 | 6/2015 | Heroux | |
| 9,310,575 B2 | 4/2016 | Matsuda | |
| 9,341,797 B2 * | 5/2016 | Nakagawa | G02B 6/43 |
| 9,627,851 B1 * | 4/2017 | Zilkie | H01S 5/042 |
| 9,939,593 B2 * | 4/2018 | Miao | G02F 1/093 |
| 9,964,702 B1 * | 5/2018 | Luo | G02B 6/12004 |
| 2001/0031109 A1 | 10/2001 | Paniccia et al. | |
| 2001/0038737 A1 | 11/2001 | Imada et al. | |
| 2002/0018507 A1 | 2/2002 | Deacon | |
| 2002/0028045 A1 | 3/2002 | Yoshimura et al. | |
| 2002/0036356 A1 | 3/2002 | Teshima | |
| 2002/0114587 A1 | 8/2002 | Golwalkar et al. | |
| 2003/0015770 A1 | 1/2003 | Talin et al. | |
| 2003/0223673 A1 | 12/2003 | Garito et al. | |
| 2004/0065843 A1 | 4/2004 | Schut et al. | |
| 2004/0109654 A1 | 6/2004 | Feger et al. | |
| 2004/0245538 A1 | 12/2004 | Wang et al. | |
| 2004/0264837 A1 | 12/2004 | Ogawa | |
| 2005/0031265 A1 | 2/2005 | Simon et al. | |
| 2005/0041906 A1 | 2/2005 | Sugama et al. | |
| 2005/0063636 A1 | 3/2005 | Joyner | |
| 2005/0136574 A1 | 6/2005 | Shih et al. | |
| 2005/0141808 A1 | 6/2005 | Cheben et al. | |
| 2005/0185900 A1 | 8/2005 | Farr | |
| 2005/0201707 A1 | 9/2005 | Glebov | |
| 2006/0045418 A1 | 3/2006 | Cho et al. | |
| 2007/0058976 A1 * | 3/2007 | Tatum | G02B 6/4201 |
| | | | 398/99 |
| 2008/0031583 A1 | 2/2008 | Ohtsu et al. | |
| 2008/0037934 A1 | 2/2008 | Daikuhara et al. | |
| 2008/0130125 A1 | 6/2008 | Goelles et al. | |
| 2008/0265416 A1 | 10/2008 | Lee et al. | |
| 2008/0279557 A1 * | 11/2008 | Park | H04B 10/572 |
| | | | 398/79 |
| 2008/0279566 A1 | 11/2008 | Miller et al. | |
| 2009/0049964 A1 | 2/2009 | Yagyu et al. | |
| 2009/0060526 A1 | 3/2009 | Matsui et al. | |
| 2009/0072393 A1 | 3/2009 | Bachman | |
| 2009/0202713 A1 | 8/2009 | Pitwon | |
| 2009/0218519 A1 | 9/2009 | McLeod | |
| 2010/0032853 A1 | 2/2010 | Naitou | |
| 2010/0104290 A1 * | 4/2010 | Nobuhara | G02B 6/4246 |
| | | | 398/82 |
| 2010/0213561 A1 * | 8/2010 | Assefa | G02B 6/12004 |
| | | | 257/432 |
| 2010/0215313 A1 | 8/2010 | Matsuoka et al. | |
| 2010/0226655 A1 | 9/2010 | Kim | |
| 2011/0030778 A1 | 2/2011 | Takacs et al. | |
| 2011/0133063 A1 * | 6/2011 | Ji | G02B 6/122 |
| | | | 250/227.24 |
| 2011/0229080 A1 | 9/2011 | Bulthuis et al. | |
| 2012/0076454 A1 | 3/2012 | Shiraishi | |
| 2012/0163821 A1 * | 6/2012 | Kwon | H01S 5/026 |
| | | | 398/79 |
| 2012/0177381 A1 | 7/2012 | Dobbelaere | |
| 2012/0314990 A1 | 12/2012 | Pitwon et al. | |
| 2013/0064494 A1 | 3/2013 | Bolle et al. | |
| 2013/0182998 A1 | 6/2013 | Andry et al. | |
| 2013/0195456 A1 * | 8/2013 | Sorin | H04B 10/504 |
| | | | 398/65 |
| 2013/0223789 A1 | 8/2013 | Lee | |
| 2014/0112616 A1 | 4/2014 | Numata | |
| 2014/0140657 A1 | 5/2014 | Shiraishi | |
| 2014/0177995 A1 | 6/2014 | Mohammed et al. | |
| 2014/0294342 A1 | 10/2014 | Offrein | |
| 2014/0321804 A1 | 10/2014 | Thacker et al. | |
| 2014/0355931 A1 | 12/2014 | Tummala et al. | |
| 2015/0043919 A1 | 2/2015 | Handelman | |
| 2015/0117824 A1 | 4/2015 | Wang et al. | |
| 2015/0132002 A1 * | 5/2015 | Krishnamurthy | H01S 5/06255 |
| | | | 398/79 |
| 2015/0168646 A1 | 6/2015 | Arai | |
| 2015/0303649 A1 | 10/2015 | Weber | |
| 2015/0333831 A1 | 11/2015 | Lai et al. | |
| 2015/0362673 A1 | 12/2015 | Zheng et al. | |
| 2015/0362676 A1 * | 12/2015 | Murison | H01S 3/067 |
| | | | 385/16 |
| 2016/0011414 A1 | 1/2016 | Joseph | |
| 2016/0156999 A1 * | 6/2016 | Liboiron-Ladouceur | H04Q 11/0005 |
| | | | 398/51 |
| 2016/0178839 A1 | 6/2016 | Tsujita | |
| 2016/0349451 A1 | 12/2016 | Shen et al. | |
| 2017/0017042 A1 | 1/2017 | Menard et al. | |
| 2017/0230117 A1 * | 8/2017 | Li | G02B 6/12002 |
| 2018/0149815 A1 | 5/2018 | Heroux et al. | |
| 2018/0159627 A1 | 6/2018 | Fazal et al. | |
| 2018/0288875 A1 | 10/2018 | Sasaki et al. | |
| 2018/0335583 A1 | 11/2018 | Jou et al. | |
| 2018/0335584 A1 | 11/2018 | Jou et al. | |
| 2018/0335585 A1 | 11/2018 | Jou et al. | |
| 2018/0335586 A1 | 11/2018 | Jou et al. | |
| 2018/0335587 A1 | 11/2018 | Jou et al. | |
| 2018/0335588 A1 | 11/2018 | Jou et al. | |
| 2018/0335590 A1 | 11/2018 | Jou et al. | |
| 2018/0337111 A1 | 11/2018 | Jou et al. | |
| 2018/0337743 A1 | 11/2018 | Jou et al. | |

FOREIGN PATENT DOCUMENTS

| | | |
|---|---|---|
| WO | WO 2018/213037 A1 | 11/2018 |
| WO | WO 2018/213038 A1 | 11/2018 |
| WO | WO 2018/213039 A1 | 11/2018 |
| WO | WO 2018/213040 A1 | 11/2018 |

(56) References Cited

FOREIGN PATENT DOCUMENTS

| WO | WO 2018/213041 A1 | 11/2018 |
| WO | WO 2018/213042 A1 | 11/2018 |
| WO | WO 2018/213043 A1 | 11/2018 |
| WO | WO 2018/213044 A1 | 11/2018 |

OTHER PUBLICATIONS

Chen et al., "Chip-Level 1 2 Optical Interconnects Using Polymer Vertical Splitter on Silieuri Substrate," IEEE Photonlcs Journal, 6:1-9 (2014).[ Retrieved from the Internet on Jun. 29, 2018 <URL:https://ieeexplore.ieee.org/stamp/stamp.jsp?tp=&arnumber=67.

Shen et al., "Implementation of Chip-Level Optical Interconnect With Laser and Photodetector Using SOI-Based 3-D Guided-Wave Path", IEEE Photonics Journal, 6:1-9, (2014).

Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.leee.org/abstract/docu.

U.S. Appl. No. 15/963,043 , Requirement for Restriction-Election dated Jun. 29, 2018.

U.S. Appl. No. 15/963,440 Requirement for Restriction-Election dated Jul. 10, 2018.

U.S. Appl. No. 15/964,889, Non-Final Office Action dated Jun. 27, 2018.

WIPO Application No. PCT/US2018/031328, PCT International Search Report and Written Opinion of the International Searching Authority dated Jul. 26, 2018.

WIPO Application No. PCT/US2018/031331, PCT International Search Report and Written Opinion of the International Searching Authority dated Jul. 26, 2018.

WIPO Application No. PCT/US2018/031333, PCT International Search Report and Written Opinion of the International Searching Authority dated Jul. 26, 2018.

WIPO Application No. PCT/US2018/031334, PCT International Search Report and Written Opinion of the International Searching Authority dated Jul. 26, 2018.

WIPO Application No. PCT/US2018/031335, PCT International Search Report and Written Opinion of the International Searching Authority dated Sep. 12, 2018.

WIPO Application No. PCT/US2018/031338, PCT International Search Report and Written Opinion of the International Searching Authority dated Jul. 31, 2018.

WIPO Application No. PCT/US2018/031343, PCT International Search Report and Written Opinion of the International Searching Authority dated Jul. 31, 2018.

WIPO Application No. PCT/US2018/031345, PCT International Search Report and Written Opinion of the International Searching Authority dated Jul. 26, 2018.

U.S. Appl. No. 15/963,043, Requirement for Restriction-Election dated Feb. 25, 2019.

U.S. Appl. No. 15/963,030, Non-Final Office Action dated Oct. 17, 2017.

U.S. Appl. No. 15/963,665, Notice of Allowance dated Oct. 3, 2018.

U.S. Appl. No. 15/964,701, Non-Final Office Action dated Oct. 5, 2018.

WIPO Application No. PCT/US2018/031336, PCT International Search Report and Written Opinion of the International Searching Authority dated Sep. 19, 2018.

Vlasov "Silicon CMOS-Integrated Nano-Photonics for Computer and Data Communications Beyond 100G", IEEE Communications Magazine, 50(2):s67-s72, (2012).

U.S. Appl. No. 15/963,440, Non-Final Office Action dated Dec. 19, 2018.

U.S. Appl. No. 15/964,889, Final Office Action dated Jan. 2, 2019.

U.S. Appl. No. 15/965,213, Non-Final Office Action dated Jan. 14, 2019.

U.S. Appl. No. 15/963,030, Non-Final Office Action dated Oct. 17, 2018.

U.S. Appl. No. 15/964,889, Notice of Allowance dated Mar. 21, 2019.

U.S. Appl. No. 15/963,014, Non-Final Office Action dated Mar. 29, 2019.

U.S. Appl. No. 15/963,014, Notice of Allowance dated Jul. 2, 2019.

U.S. Appl. No. 15/963,030, Final Office Action dated May 15, 2019.

U.S. Appl. No. 15/963,030, Notice of Allowance dated Jul. 16, 2019.

U.S. Appl. No. 15/963,043, Non-Final Office Action dated Jun. 27, 2019.

U.S. Appl. No. 15/963,440, Final Office Action dated Apr. 23, 2019.

U.S. Appl. No. 15/963,440, Non-Final Office Action dated Jun. 6, 2019.

U.S. Appl. No. 15/963,815, Non-Final Office Action dated Jun. 17, 2019.

U.S. Appl. No. 15/964,701, Final Office Action dated May 2, 2019.

U.S. Appl. No. 15/964,701, Non-Final Office Action dated Jun. 14, 2019.

U.S. Appl. No. 15/965,213, Notice of Allowance dated Jun. 5, 2019.

U.S. Appl. No. 15/963,043, Notice of Allowance dated Nov. 4, 2019.

U.S. Appl. No. 15/963,440, Final Office Action dated Oct. 3, 2019.

U.S. Appl. No. 15/963,815, Final Office Action dated Oct. 7, 2019.

U.S. Appl. No. 15/963,815, Notice of Allowance dated Oct. 29, 2019.

* cited by examiner

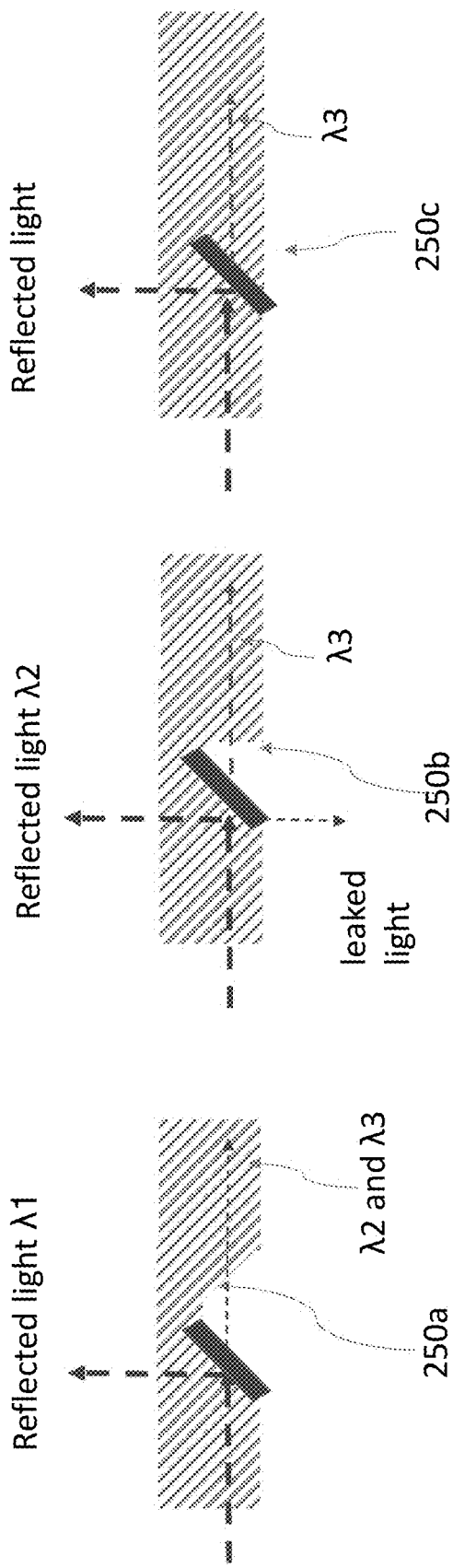

THREE-DIMENSIONAL WDM WITH 1×M OUTPUT PORTS ON SOI BASED STRAIGHT WAVEGUIDES COMBINED WITH WAVELENGTH FILTERS ON 45 DEGREE REFLECTORS

CROSS REFERENCE TO RELATED APPLICATIONS

This application claims the benefit of U.S. Provisional Patent Applications No. 62/508,940, titled "OPTICAL COUPLING STRUCTURE" filed on May 19, 2017, and No. 62/509,892, titled "OPTICAL INTERCONNECT MODULES" filed on May 23, 2017, which are incorporated by reference herein in their entirety.

FIELD

Embodiments described herein relate to optical interconnect modules, and more particularly optical sub-assembly systems in optical interconnects.

BACKGROUND

Cloud computing, enterprise networks, and data center networks continue to drive increased bandwidth demand of optical waveguides for metro and long haul wires, and also rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a number of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module includes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, a prism, and a fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves an external lens alignment, adding complexity and energy loss. It becomes more complicated if multiplexing is involved. A less complicated assembly technique with multiple output ports is needed to improve efficiency and reduce cost.

SUMMARY

The application discloses an optical WDM interconnect apparatus, which includes: a substrate having a first silicon surface and a second silicon surface, which are substantially parallel to each other, and an oxide layer is embedded under the first silicon surface, and an insulating layer is disposed on the second silicon surface. This substrate can be a silicon wafer or a SOI wafer; a silicon waveguide device disposed on the first silicon surface. The waveguide has a first end reflector, a plurality of sequentially arranged WDM reflectors along the silicon waveguide device, and a second end reflector. The first end reflector is broadband coated to take light from a broadband light source which contains a plurality of wavelengths. The waveguide also has a plurality of sequentially arranged WDM reflectors, and a second end reflector each, these latter reflectors are narrow band coated so each reflector only reflects one of the plurality of wavelengths from the light source. There are also a plurality of output ports from optical receivers. The first end reflector is aligned to the input optical source, the plurality of sequentially arranged WDM reflectors and the second end reflector each are sequentially aligned to the plurality of output optical receivers.

Optionally, plurality of sequentially arranged WDM reflectors comprises 45 degree micro-reflectors.

Optionally, the silicon waveguide device is fabricated in (100) silicon crystal facet of the first silicon surface, and the 45 degree micro-reflectors are formed on (110) crystal facet.

Optionally, a layer of oxide is grown on the silicon waveguide device to form a cladding structure.

Optionally, the input optical device is a fiber carrying a broad band input light.

Optionally, the input optical device is a broadband vertical cavity surface emission laser (VCSEL).

Optionally, the plurality of output optical devices is photodiodes (PDs), wherein the photodiodes are silicon diodes or a hybrid type of silicon and germanium diodes.

Optionally, the silicon waveguide device further comprises a rear reflector behind each of the plurality of sequentially arranged WDM reflectors, wherein the rear reflector is coated with an anti-reflective coating to transmit light passing said sequentially arranged WDM reflector.

Optionally, the substrate has a thickness ranging from 50 microns to 2 mm.

Optionally, the rear reflector is a 45 degree micro-reflector.

Optionally, the rear reflector is perpendicular to the waveguide direction.

Optionally, the plurality of sequentially arranged WDM reflectors each is a surface embedded in the silicon waveguide.

Optionally, the silicon waveguide further comprises a plurality of conductive lines on the insulating layer on the second silicon surface.

Optionally, the plurality of conductive lines comprises tungsten (W), aluminum (Al), copper (Cu), gold (Au), silver (Ag), stainless steel, or an alloy.

The application also discloses a method of fabricating an optical WDM interconnect apparatus, comprising: providing a substrate having a first silicon surface and a second silicon surface, in the first silicon surface is on an embedded oxide layer; patterning a strip-like waveguide on the first silicon surface; patterning two 45 degree reflectors at ends of the silicon waveguide; patterning a plurality of sequentially arranged WDM reflectors along the silicon waveguide; coating the sequentially arranged WDM reflectors with narrow band high reflective coatings at a plurality of wavelengths $\lambda i$ (i=1, 2, 3, . . . ); aligning the WDM reflectors sequentially to a plurality of optical receivers; turning the substrate over to work on the second silicon surface; depositing an insulating layer on the second silicon surface; and patterning conductive lines in the insulating layer on the second silicon surface.

Optionally, patterning the conductive lines comprises forming trenches and filling in metal in the trenches, followed by removing excess metal by polishing (CMP) or by selective etch to clean up metal outside the trenches.

Optionally, patterning the conductive lines comprises depositing a metal layer, patterning the metal layer into lines, followed by removing excess metal by polishing (CMP) or by selective etch.

Optionally, the method also includes assembling a fiber input light source and multiple receiver devices on the conductive lines.

The disclosed configuration separates the active photonics devices on silicon substrate layer from passive optical devices on silicon device layer of SOI. The active devices can be realized by CMOS fabrication or hybrid integration when germanium device is included. The passive devices can be realized by MEMS (non-CMOS) fabrication.

BRIEF DESCRIPTION OF THE DRAWINGS

Having thus described some embodiments in general terms, reference will now be made to the accompanying drawings, which are not necessarily drawn to scale.

Figure 1:
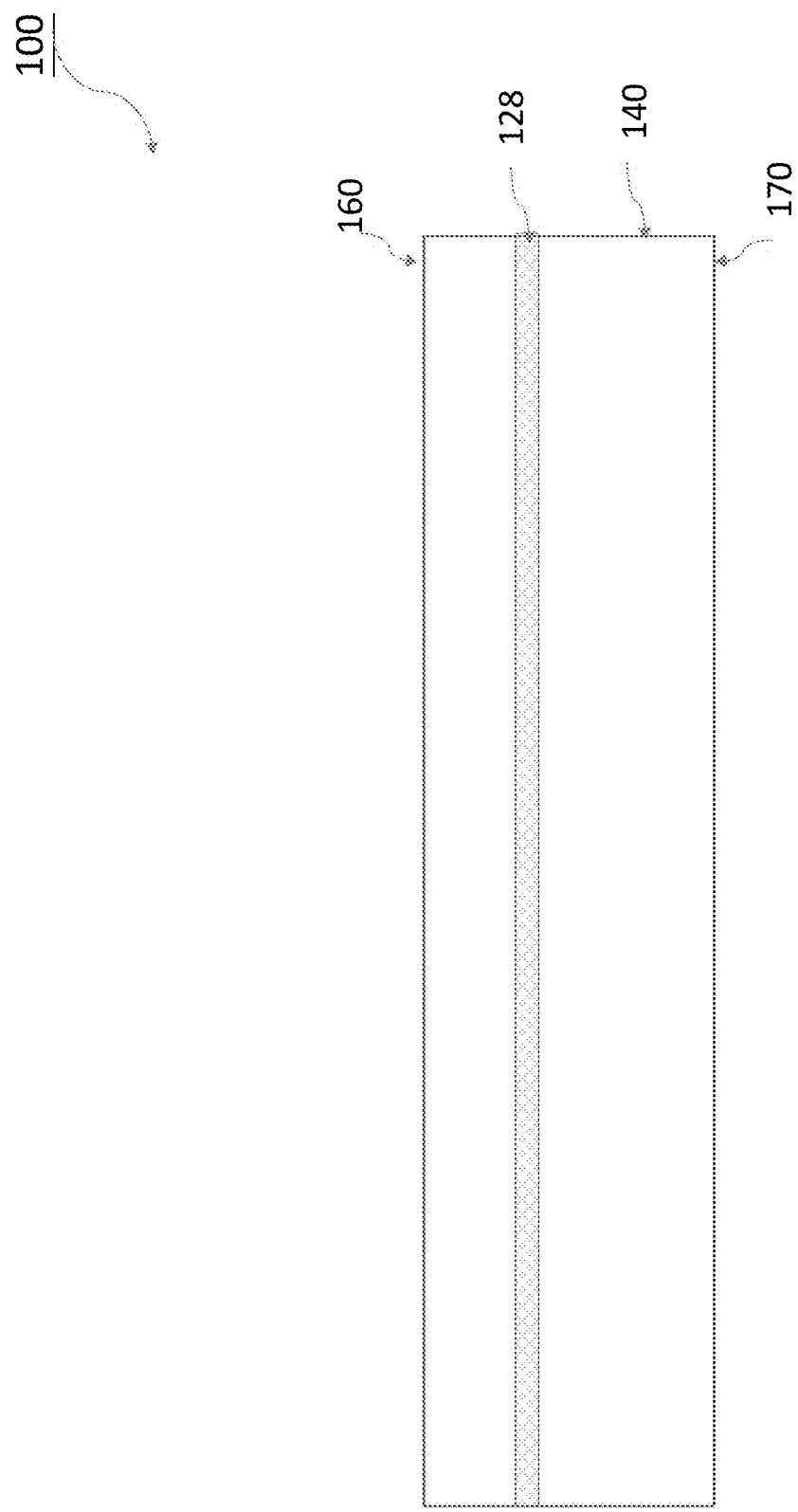

FIG. 1 illustrates a SOI substrate for an optical coupler in accordance with an embodiment of the disclosure.

Figure 2:
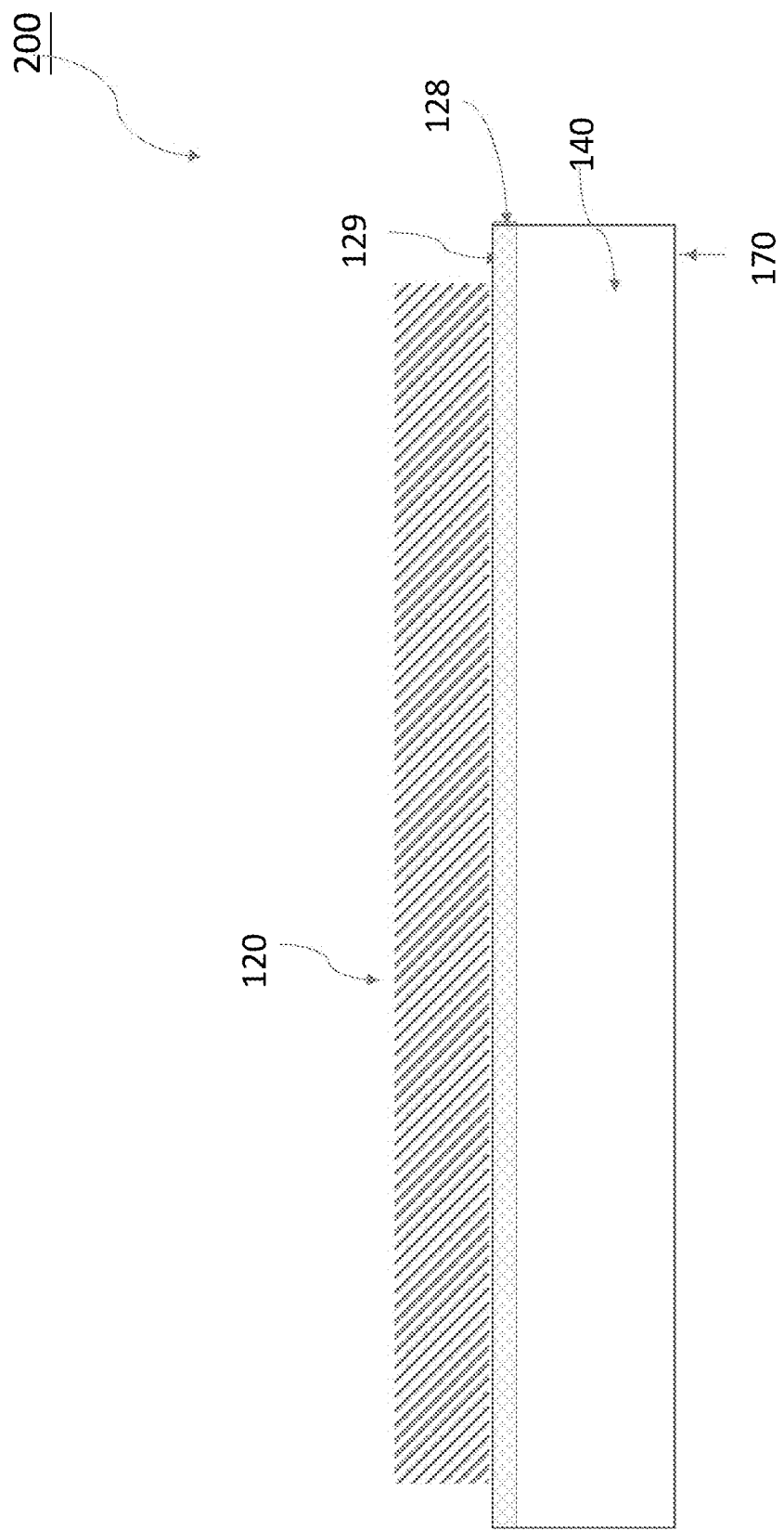

FIG. 2 shows a schematic intermediate cross section in making a silicon waveguide on the silicon device surface of a SOI substrate in accordance with an embodiment of the disclosure.

Figure 3A:
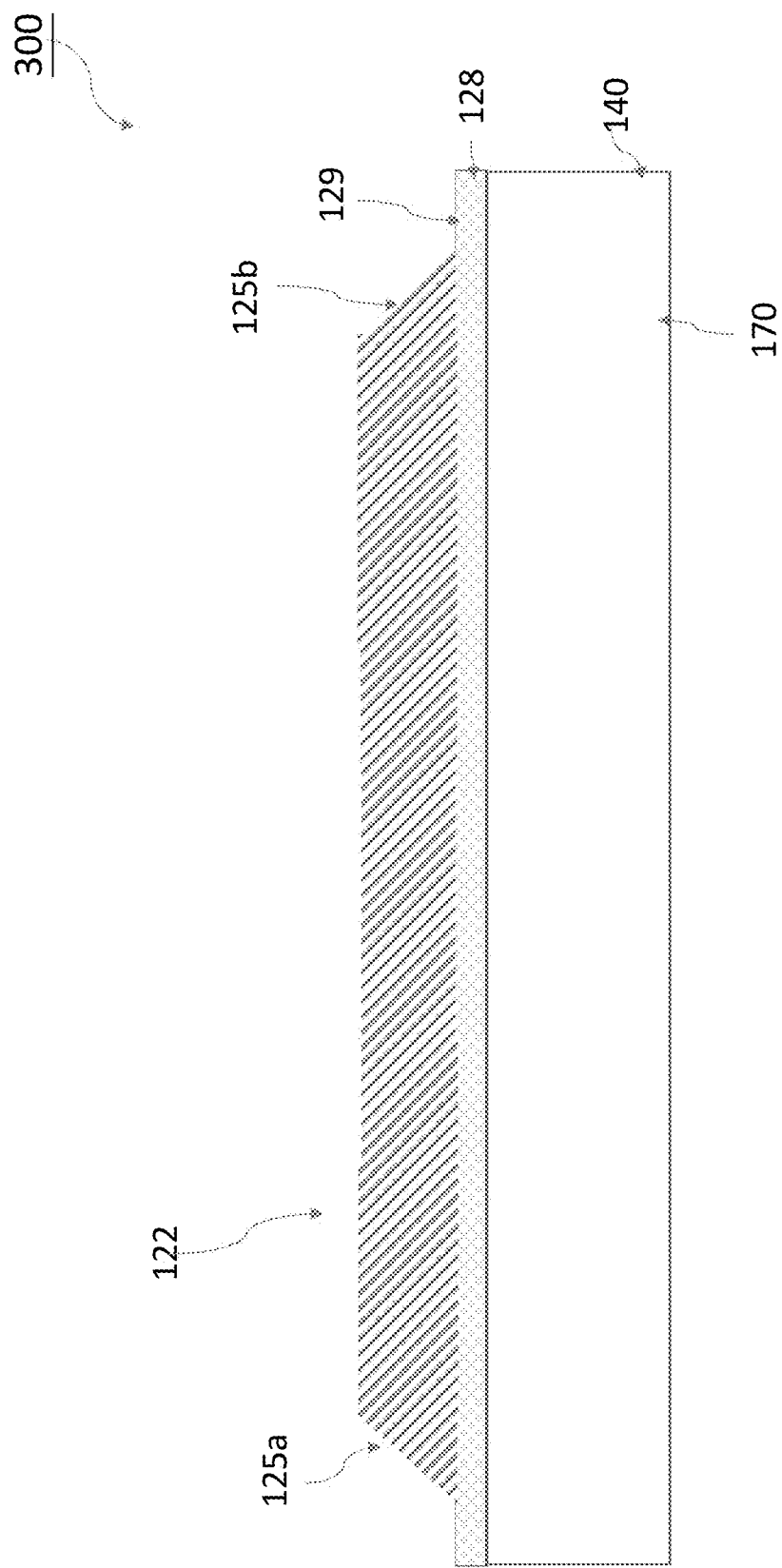

FIG. 3A shows a schematic cross section of another intermediate step in forming the 45 degree end reflectors of the silicon waveguide on the silicon device surface of a SOI substrate in accordance with an embodiment of the disclosure.

Figure 3B:
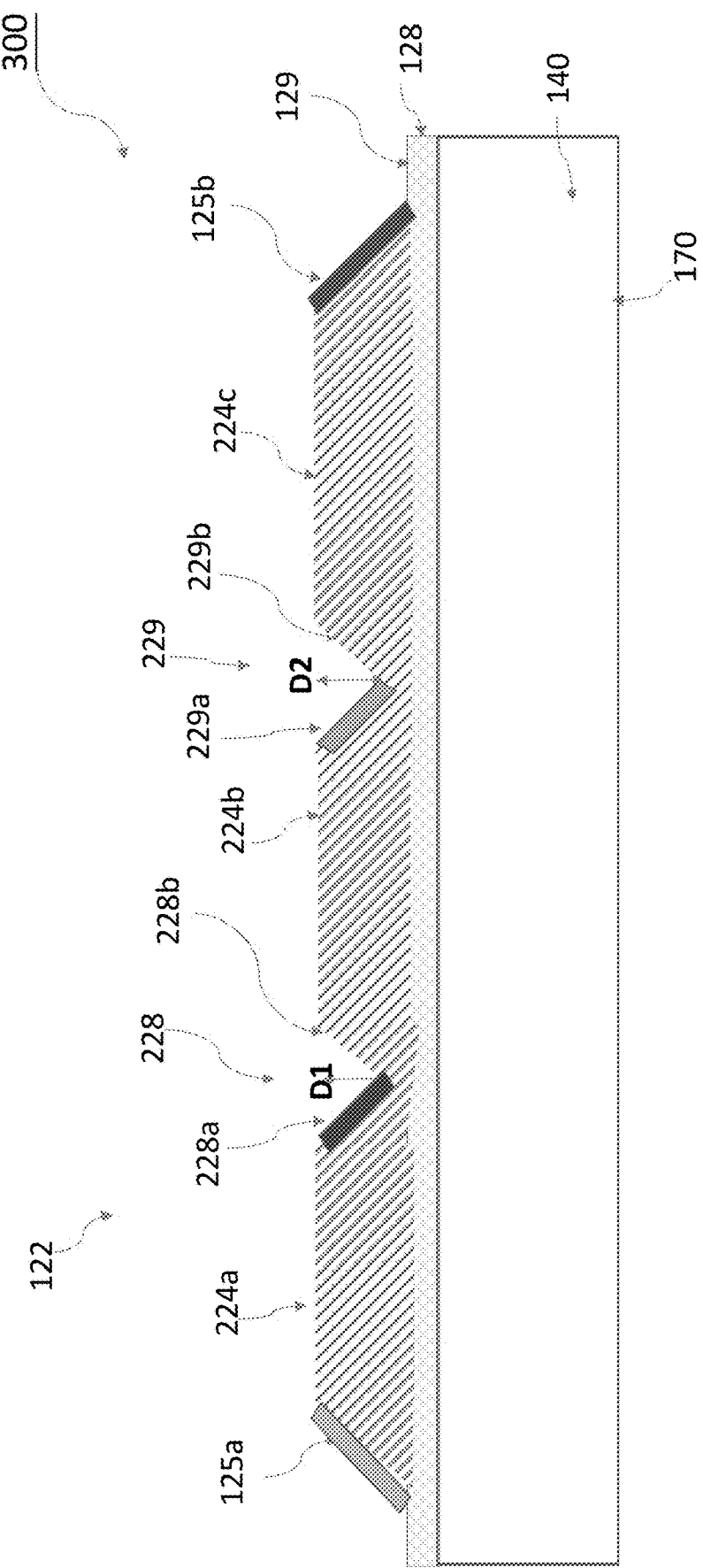

FIG. 3B shows forming multiple color filter coated 45 degree micro-reflectors of the waveguide on the silicon device surface of a SOI substrate in accordance with an embodiment of the disclosure.

FIG. 3C-3E illustrates schematic configurations of different WDM splitter designs of the optical coupler in accordance with an embodiment of the disclosure.

Figure 4:
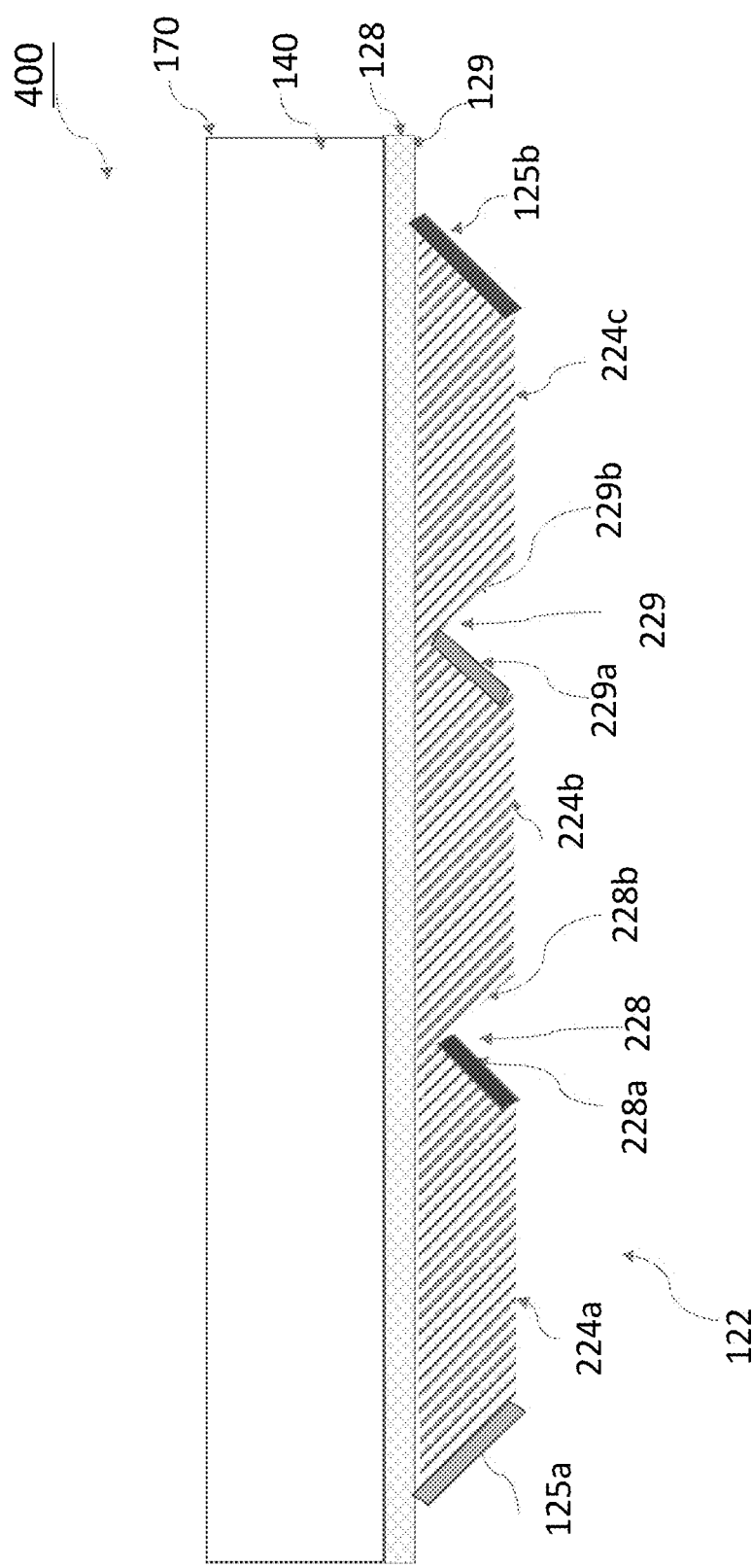

FIG. 4 illustrates a schematic cross section of the optical coupler as the finished waveguide is flipped over to the bottom side prior to fabrication of active devices.

Figure 5:
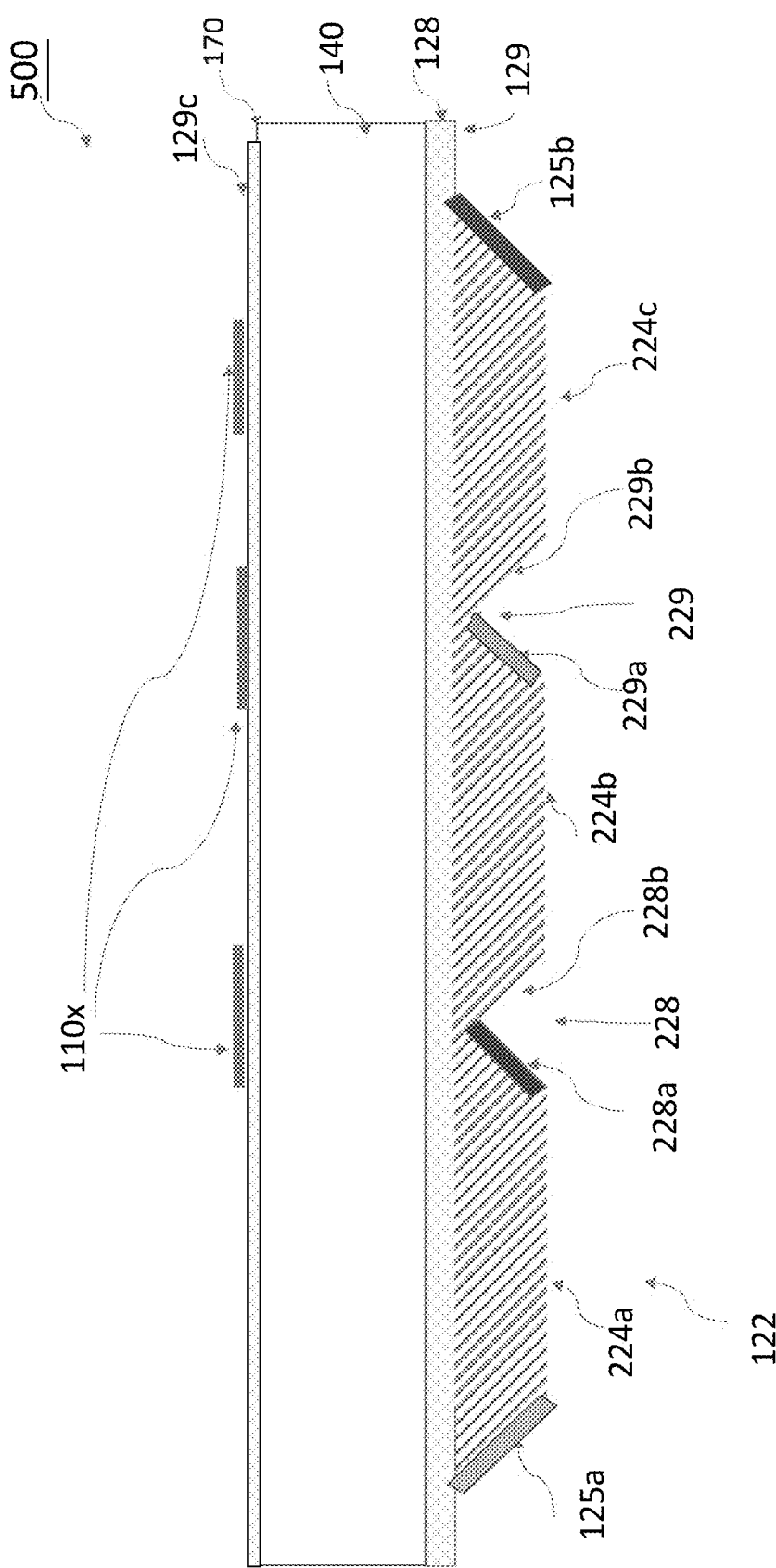

FIG. 5 illustrates the process step of patterning contact lines for multiple active devices on the SOI substrate in accordance with an embodiment of the disclosure.

Figure 6:
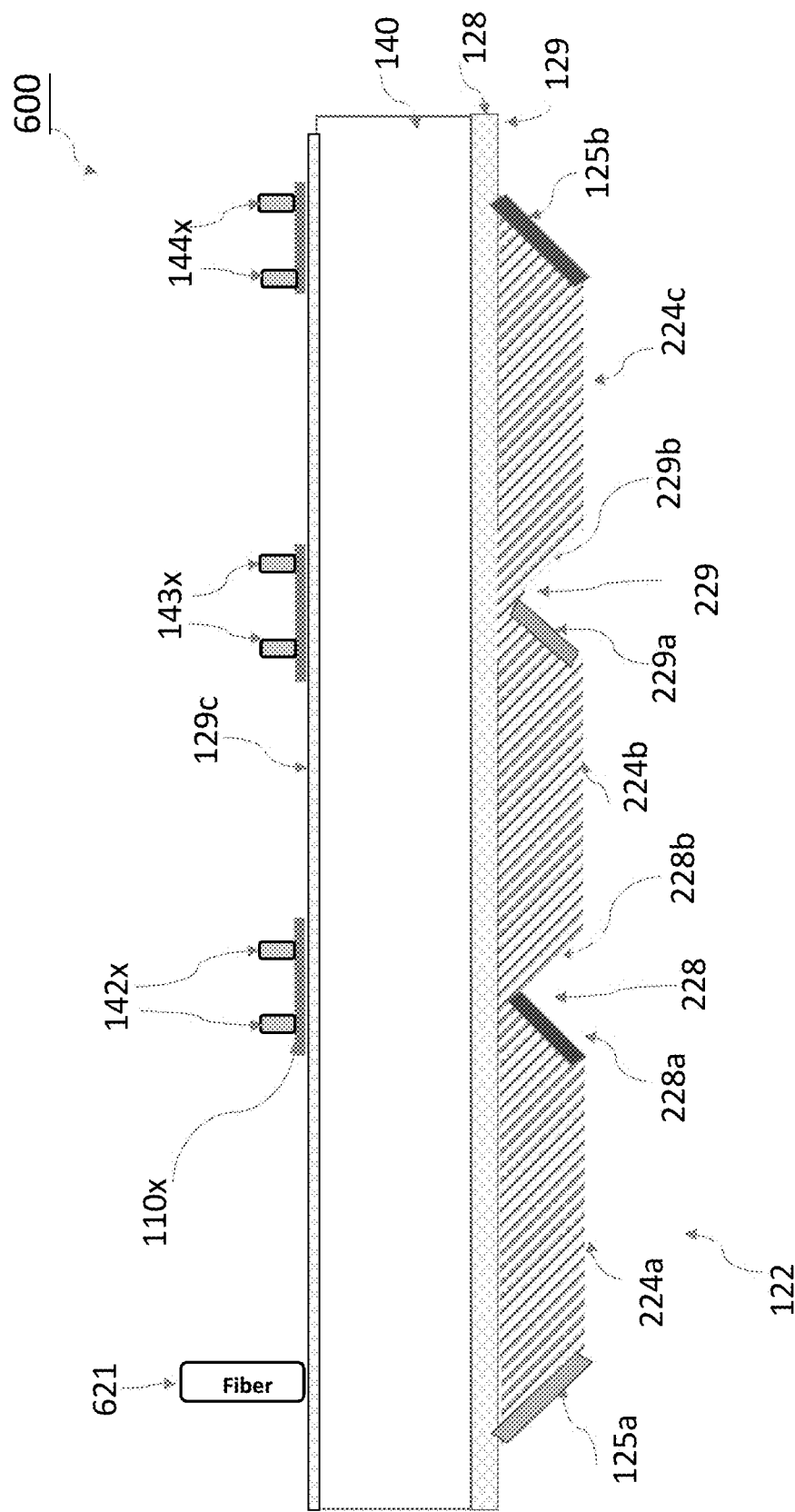

FIG. 6 illustrates disposing solder bumps for interconnecting active devices on the silicon substrate side of SOI substrate in accordance with an embodiment of the disclosure.

Figure 7:
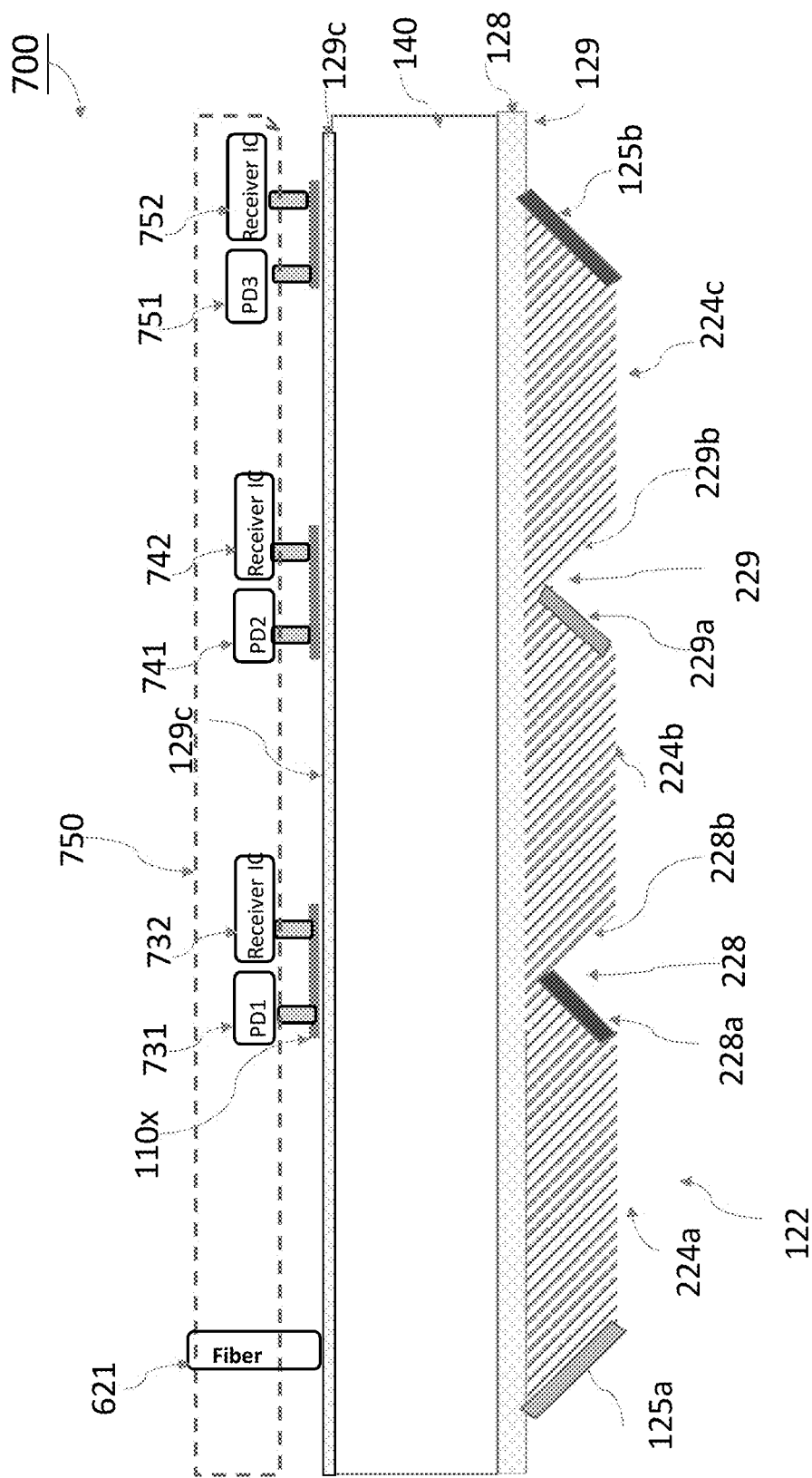

FIG. 7 illustrates a schematic diagram of assembling active devices on bond pads on the silicon substrate side of a SOI substrate in accordance with an embodiment of the disclosure.

Figure 8:
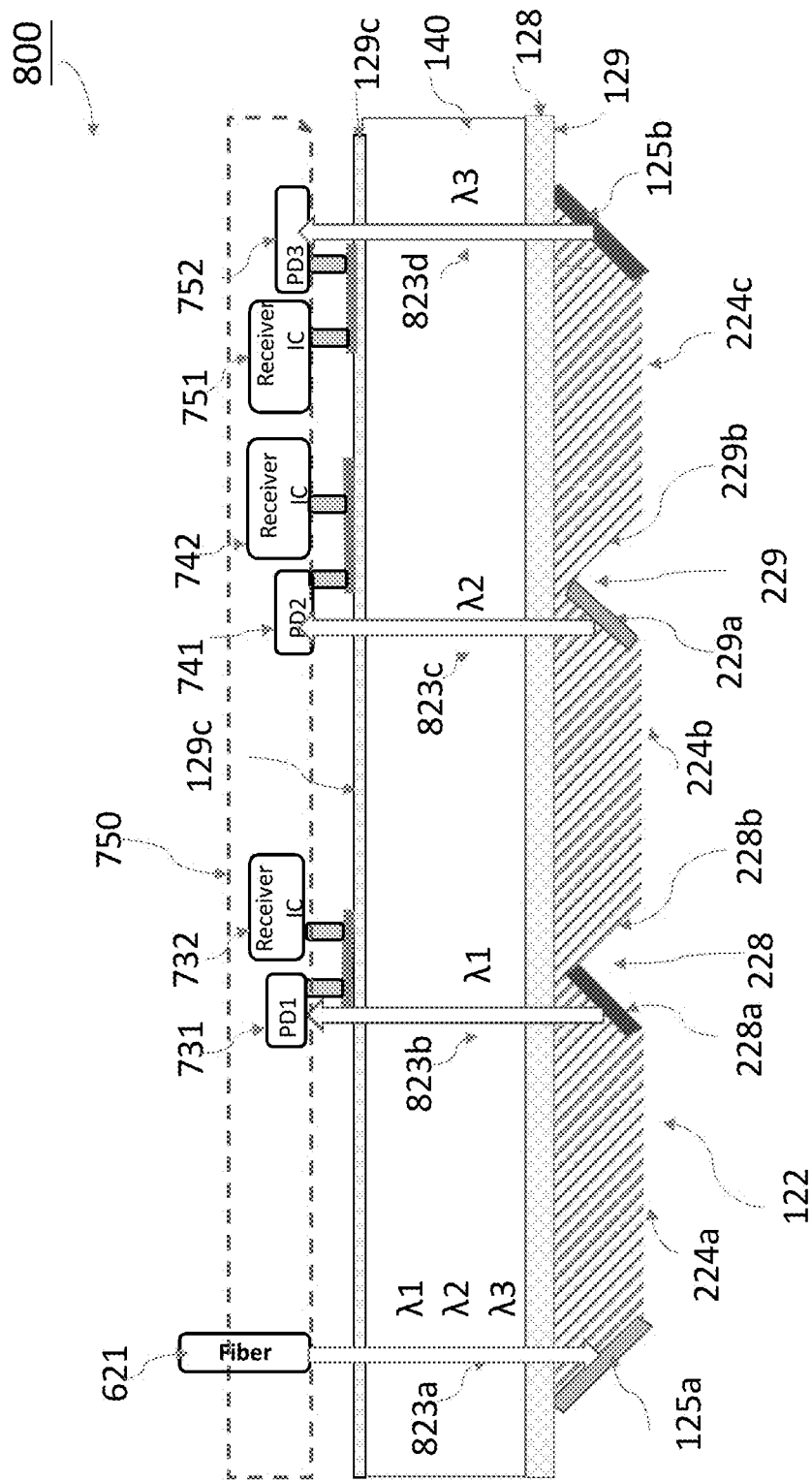

FIG. 8 illustrates a schematic optical paths of the disclosed WDM optical interconnect module, which has one fiber input and three WDM output optical ports on the SOI substrate, in accordance with an embodiment of the disclosure.

Figure 9:
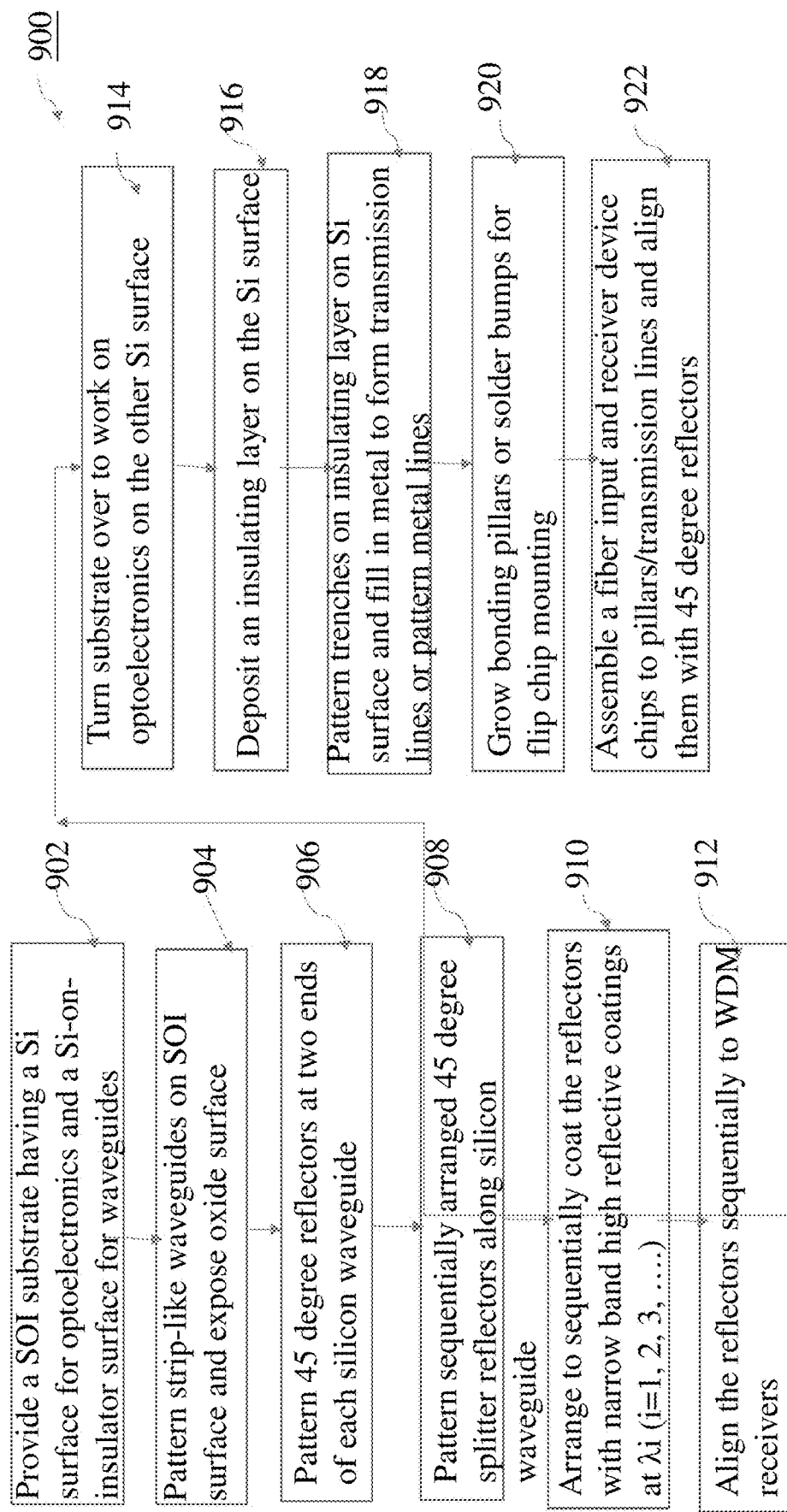

FIG. 9 is a schematic flow chart illustrating a method for fabricating the WDM optical interconnect module in accordance with an embodiment of the disclosure.

Figure 10:
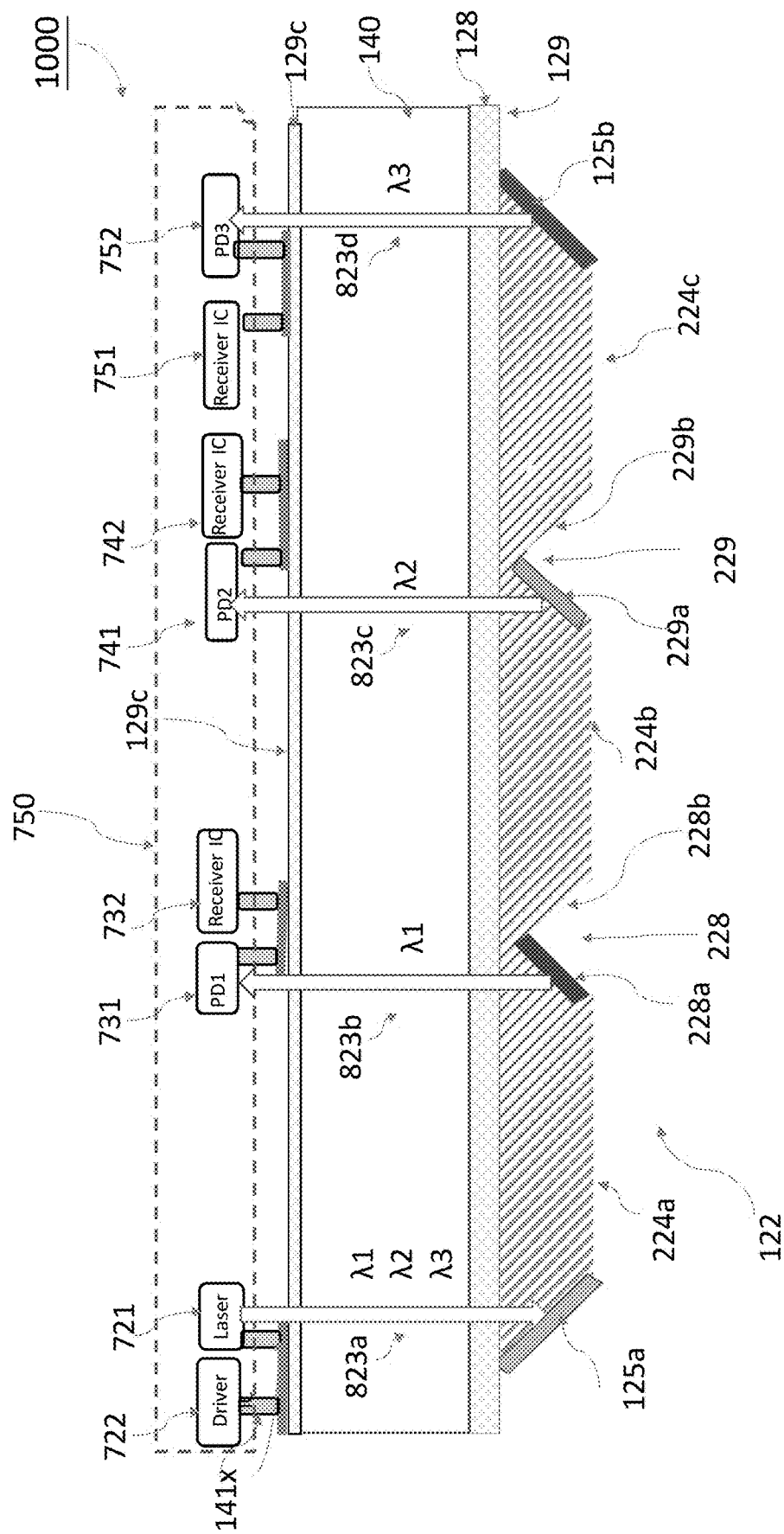

FIG. 10 illustrates a schematic WDM optical interconnect module, which has one diode laser input port and three WDM output optical ports on the SOI substrate, in accordance with another embodiment of the disclosure.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Optical interconnect is a means of communication by optical fiber cables. Compared to traditional cables, optical fibers are capable of a much higher bandwidth, from 10 Gbit/s up to 100 Gbit/s. An onboard interconnecting WDM has wide applications. Optical communication systems often apply a laser source via a fiber input, when the active light source does not reside in the interconnect module.

However, an active light source on the interconnecting module, like a multiple wavelength broadband light from which a multiplexed narrow band wavelength output is desired. A broadband laser, maybe a vertical-cavity surface-emitting laser VCSEL is frequently applied for convenient configurations and easy assembling.

The vertical-cavity surface-emitting laser, or VCSEL is a type of semiconductor laser diode with laser beam emission perpendicular from the top surface, contrary to conventional edge-emitting semiconductor lasers (also in-plane lasers)

which emit from surfaces formed by cleaving the individual chip out of a wafer. Vertical cavity self-emitting laser or VCSEL laser emitting light at wavelengths from 650 nm to 1300 nm are typically based on gallium arsenide (GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as a non-conductive film (NCF), may also be applied to enhance adhesion of the components to the silicon substrate. The high speed electrical traces, including an RF transmission devices, are designed on the waveguide surface to connect the driver IC and VCSEL arrays as well as to connect trans-impedance amplifier (TIA) arrays. Typically a VCSEL array has four VCSEL lasers packed in a row.

In accordance with an embodiment, the data rate of the optical engine can be operated at 25 Giga-bits per second (Gbps) per channel, and can be extended to higher data rates such as 50 Gbps per channel. VCSEL applications include fiber optic communications, precision sensing, computer mice and laser printers.

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. In addition, assembly time can be reduced compared to conventional techniques through use of semiconductor process technologies for the formation of transmission lines and flip chip integration of the active devices such as the driver IC chip, laser, PD, and receiver (e.g. TIA) chip. In addition, the fabrication techniques may allow for improved RF performance of the electrical signals and increased data rates of the optical interconnects. The embodiments illustrated below may be integrated as a PCB-based optical interconnect. In particular, the embodiment may be utilized to improve optical coupling with the fiber input light or VCSEL/PD by monolithically integrating a silicon wafer interposer with a VCSEL laser within a packaging platform like PCB, and a polymer waveguide.

As shown in FIG. 1, a SOI substrate 100 consists of a silicon body 140, a first silicon surface 160, known as a device surface in the SOI, above an embedded oxide layer 128, and a second silicon surface 170, also known as a silicon substrate surface. The embedded oxide layer 128 is typically a layer of silicon oxide formed by implanting oxygen into the silicon wafer surface to form a well-defined SiOx layer desired in its depth, thickness, and composition. Standard SIMOX wafers from a deep oxide implant followed by surface annealing are used to prepare for the SOI substrates. IC devices demanding low leakage or radiation protection are often fabricated on the SOI surface in IC fabrication, therefore the silicon-on-insulation surface 160 is often referred to as a device layer in semiconductor terms. In this disclosed invention, this SOI surface supports a passive optical waveguide.

The silicon substrate 140 typically has high infrared transmission characteristics at the working infrared wavelength of the optical interconnect device. High transmission is a result from low light absorption and low light scattering of from the silicon substrate's body material and from the substrate surfaces. For infrared light in the range of 1300 nanometers to several microns commonly used in telecommunication applications, silicon body material has a low absorption characteristics. The substrate 140 has two well-polished top surface, aka device surface 160 and bottom surface, aka substrate surface 170. The top and bottom surfaces can be parallel or slightly wedged to each other to get low optical internal reflection noise. The thickness of the SOI substrate 140 is chosen to be thin so it has low transmission loss optically and also thick enough so it has sufficient strength as an interposer to support optical elements on both top and bottom surfaces during its fabrication process and also during its long term operation. Typically the SOI substrate has a thickness in the range of 50 microns to 2 millimeters.

Another embodiment includes a metal plate attached to the SOI substrate as part of the interposer to provide more mechanical strength. Special windows on the metal plate should be made to pass light back and forth in this module.

Although in a common process of making optical interconnect modules, a waveguide may be formed separately first and attached to one surface of a substrate later using an adhesive film, this application discloses an integrated process in which a three dimensional silicon waveguide is fabricated inside the silicon layer above the embedded oxide nearly simultaneously as the active photonic devices are built upon the other surface of the same SOI substrate. As an integrated part of the substrate, the three dimensional silicon waveguide offers a higher transmission at waveguide-substrate interfaces and more stable alignment along the entire optical path, compared with the commonly used separate-and-attach way described above. In addition, an integrated process has a better scaling prospect on silicon substrate. As a result, fabrication cost of building waveguide-based optical couplers is significantly reduced.

FIG. 2 shows a schematic intermediate cross section in making a silicon waveguide on a SOI substrate, in accordance with an embodiment of the disclosure.

As shown in the diagram 200 in FIG. 2, a strip structure 120 is patterned on the first silicon surface, also known as a silicon device surface of the SOI substrate 140. The surface silicon material outside the strip is removed all the way down to the insulating layer 129. End portions of the strip structure are straight downward cuts as cliffs. This patterning step is performed using lithography techniques and selective etch when silicon outside the strip structure is removed, but silicon oxide is intact and exposed afterwards. FIG. 3A shows a schematic cross section of another intermediate step in forming the 45 degree end reflectors of the silicon waveguide on the silicon device surface of a SOI substrate, in accordance with an embodiment of the disclosure. To make a 45 degree tapered slope, lithography process applies varying exposure energies. There are a number of ways to control exposure energy to achieve accurate, reproducible, and mirror like reflectors. For example, a moving exposure shutter or a programmable shrinking light window during photo-exposure, or a programmable scanner light intensity variable during exposure period, are possible techniques.

To realize demultiplexing broadband input light from one input port into multiple narrow wavelength output ports on the same surface, a number of optically coated and sequentially placed 45 degree micro-reflectors are fabricated in the waveguide mounted on the opposite side from the in/out ports of the SOI substrate. FIG. 3B shows forming multiple optically coated 45 degree micro-reflectors of the waveguide on the silicon device surface of a SOI substrate in accordance with an embodiment of the disclosure. Referring to FIGS. 3A-3B, thus formed waveguide 122 includes three straight portions 224a, 224b, and 224c, and two 45 degree end reflectors 125a and 125b which serve as bending mirrors, and a number of sequentially arranged 45 degree light splitter structures between the two end reflectors 125a and 125b. As an example, there are two splitters 228, 229 only in this embodiment. There can be more than two sequential splitters in other applications.

In all configurations, for appropriate light splitting, angle control tolerance, and surface roughness are critical factors to high optical path efficiency. Knowledge accumulated in MEMS process is well suited for fabrication of these microscopic mirrors/reflectors.

What is disclosed in FIGS. 3A-3B is an exemplary embodiment. As general splitter configurations, the sequential stages work as described below. Each of the sequentially arranged 45 degree light splitters 228 and 229 has a recess structure. The recess structure is designed to have one 45 degree micro-reflector located in the front facing the traveling optical beam to partially reflect up a desired fraction of the light by 90 degrees and transmit the rest of the traveling optical beam to continue along the straight waveguide. In addition to using area or wavelength controlled reflective light splitter, a beam splitter can have other types such as selective reflection coating, absorption coating, or polarization film coating, etc. for controlled splitting. The area controlled reflective light splitter has the advantage of being simple, light weight and easy to manufacture.

The first recess structure 228 includes one or two tapered side walls 228a and 228b (second side slope 228b is optional), and the structure has a first recess depth D1. The first or front micro-reflector 228a reflects with its 45 degree slope a first fraction of the entire light beam upward back into the silicon substrate toward the first photodetector receiver. The exact amount of the first fraction light is a function of the first recess structure features such as its width, depth and area. The second slope 228b does not contribute to the reflection, but it collects remaining light which passes straight through the first reflective surface 228a. Without any film coating, the second slope 228b would bounce the light away from the waveguide as leaked out light. This leaky loss may be acceptable in an area controlled beam splitter, but in a WDM splitter, an anti-reflection coating is added on the second slope surface to pass the other desired wavelengths for the next WDM stage as much as possible.

The second recess structure 229 includes one or two reflectors 229a and 229b whereas the second side wall 229b is optional. The second recess structure has a second recess depth D2. The first micro-reflector 229a of the second recess structure 229 splits a second fraction of the remaining traveling light after the first recess with its 45 degree reflector 229a and the split off light goes back into the silicon substrate toward the second photodetector receiver. The exact amount of the second fraction of light is a function of the recess structure features such as width, depth and area. The second slope 229b does not contribute to the splitter reflection directly, but it collects remaining light from the first reflector 229a, and it is anti-reflection coated for the other WDM wavelengths to avoid bouncing the remaining light away from the waveguide. The remaining light after the second recess continues to travel in the waveguide.

The tapered side walls in the recess structures are fabricated with variable lithographic exposure energies. The desired sequentially deeper recess structures shall be made in multiple steps. The first step is to achieve recess depth D1 in the first and second recesses. It includes applying moving exposure shutters or shrinking/expanding light windows or programmed light intensity control during photo-exposure followed by etch to form tapered shapes. The second recess structure 229 and its side walls 229a and 229b have the same recess depth D1 initially. The second step is applied to achieve deeper recess depth D2 for the next recess structure. For the deeper second recess, one applies additional exposure energy control, meanwhile one has to block exposure light by applying a dark area in the lithography mask over the first recess structure so the recess depth D1 remains unchanged when the second recess is exposed. The same technique is applied repeatedly if more sequential splitting stages are fabricated.

The second walls 228b and 229b of the respective first and second recess structures can be straight walls without the 45 degree slope to avoid unwanted scattering or ghost lights.

Typically the SOI wafer surfaces on the device surface side are (100) crystalline silicon, so the silicon waveguide is fabricated in (100) silicon crystal facet, and the waveguide sidewalls are formed on (110) crystal facet.

It is recommended to seal the waveguide hermetically with a stable material having a refractive index lower than that of silicon to guarantee total internal reflection in the waveguide. Given that silicon's dielectric constant at 1100 nm or longer is about 3.50, and an oxide film has low index 1.45, a thick oxide film can be a good cladding for the waveguide. Native oxide grown in ambient over the exposed silicon surface is about 10 nm in thickness. The native oxide will not provide a good seal to stop evanescent light leaking into a vicinity of high index and high leaky materials. Therefore, the waveguide should not be exposed to open ambient, instead it needs to be coated or covered with a cladding layer such as silicon oxide at least several wavelengths thick. Such option is not shown in the figures here.

For wavelength division multiplexing (WDM) applications, each splitter is designed to sequentially reflect light at a desired narrow band wavelength to the sequentially located optical receiver and pass light at other wavelengths to the next sequential splitting stages. In the exemplary application shown in FIG. 3B, the first splitter structure 228 has two reflector surfaces 228a and 228b. In each splitter structure, the front reflector is responsible to select the desired wavelength for the WDM stage and reflect it to the WDM receiver, and the rear reflector is just as critical to transmit to the fullest efficiency the leftover light desired for the sequential WDM stages. Therefore, 228a is narrow-band coated to reflect wavelength λ1, and transmit λ2 and λ3. 228b is coated to be anti-reflective to λ2 and λ3. Similarly, the second splitter structure 229 has two reflector surfaces 229a and 229b. 229a is narrow-band coated to reflect wavelength λ2, and transmit λ3. 229b is coated to be anti-reflective to λ3. The end WDM reflector surfaces 125b is narrow-band coated to reflect wavelength λ3.

Selective coating for reflection or for anti-reflection includes multiple layer constructive interference coating or selective absorption coatings.

The relative sizes of the front reflectors at various sequential WDM splitter stages are designed to have proper WDM splitting ratios. The rear reflector size is typically designed to be not smaller than the front reflector, i.e., reflector 228b at least transmits light passed from the front reflector 228a, and reflector 229b at least transmits light passed from the front reflector 229a.

FIG. 3C-3E illustrates schematic configurations of different WDM splitter designs of the optical coupler in accordance with embodiments of the disclosure. The slanted angle of the rear reflector can be designed differently as the front reflector for maximizing the transmission of desired wavelength.

In FIG. 3C, the rear surface 250a has anti-reflective coating at about 45 degree input for light λ2 and λ3. In addition to a similar angle design, FIG. 3D discloses a rear surface 250b perpendicular to incoming light, it has anti-reflective coating for light λ2 and λ3 at the normal to surface 250b. There is another possible configuration shown in FIG. 3E, the sequential WDM splitter 250c is fabricated as an embedded surface, so there wouldn't be any rear reflector.

FIG. 4 illustrates a schematic cross section of the optical coupler as the finished waveguide is flipped over to the bottom side prior to fabrication of active devices. In the process of working on the SOI substrate, the SOI is held firmly by a stage holder of some sort, preferably the devices on both surfaces are not physically touched. It is optional which surface is the first one to fabricate devices on. As an examplenary method, waveguide side is worked on first before the optoelectronic active devices are attached as disclosed above. To work on assembling the active devices on the substrate side of SOI after the waveguides are completed, the SOI wafer is flipped upside down and the passive waveguides are facing down as the wafer is held on the edge by a support stage. However, there may be an advantage of packaging the active device side first and patterning the waveguides second. It can be more risky to process waveguides first and then hold surface with the completed waveguides facing down, because the down facing passive optics is fragile and can get damaged when it contacts the stage.

FIG. 5 illustrates the process step of patterning contact lines for multiple active devices on the SOI substrate in accordance with an embodiment of the disclosure.

An insulating film 129c is either deposited or grown on the silicon surface 170. The surface 170 is a platform to host interconnects for active optical devices, such as a fiber port, a fiber laser, or laser diodes in a transmitter or photodetectors in a receiver, and supporting electronic contacts. Because silicon is semiconductor, unlike quartz or glass, the top surface needs to be covered with an insulating material before electronic devices can be attached. The insulating material can be an oxide, a nitride or alike.

To package active devices on the surface, first, conductive lines 110x, also called electrical traces, are patterned on the clean insulating surface of SOI as transmission lines of the optical interconnects. Note that in FIG. 5, not all transmission lines are drawn or labeled. Copper, aluminum, tungsten, titanium, stainless steel, or alloys are chosen as materials for high speed transmission lines. Metal layer deposition or other coating techniques known in the semiconductor industry can be applied followed by metal patterning. These techniques include, but not limited to, wet/dry etch, metal plating, or laser writing. Other techniques to form transmission lines can also be applied such as, for example, first forming trenches into the insulating layer on the top surface of the substrate; second, depositing a metal layer on the top surface to fill the trenches, followed by a planarization technique like chemical mechanical polishing (CMP) or selective dry/wet etching to remove the excess metal from outside the trench areas. The insulating layer 129c on the silicon surface is necessary to insulate the transmission lines from the bulk silicon surface.

FIG. 6 illustrates disposing solder bumps for interconnecting active devices on the silicon substrate side of SOI substrate in accordance with an embodiment of the disclosure.

After patterning transmission lines 110x on the insulating layer on the top surface, proper bonding pillars 142x, 143x, and 144x are formed on the transmission lines 110x as contacting points for connecting to active optical devices or other electronics. Not all bonding bumps are shown as 141x-144x in FIG. 6. If a passive light source is desired, an optical fiber is often used to carry light from a laser source, as shown in FIG. 6. The fiber light input 621 is assembled on the surface without electric connection. However the light source can also be a laser such as a broadband or wavelength scanning laser diode such as a DFB laser or a vertical cavity surface emitting laser (VCSEL) an electric trace and bonding pillar should be made to enable an external power supply. The connections from this substrate interposer 140 to external circuits may be achieved by a variety of semiconductor packaging techniques.

The SOI substrate forms an interposer as a mechanical support structure for mounting to a PCB board, a silicon waveguide or waveguides in a multi-channel system. Without the SOI substrate supporting as an interposer, a flexible circuit board built on a film maybe too fragile to support the electronic devices and waveguides.

FIG. 7 illustrates a schematic diagram of assembling active devices on bond pads on the silicon substrate side of a SOI substrate in accordance with an embodiment of the disclosure.

Optical input devices in this system such as an optical fiber 621 carrying light, or active device vertical cavity surface emission laser (VCSEL) which is not show in FIG. 7, the first photodiode (PD1) 731 and its receiver IC 732, the second photodiode (PD2) 741 and its receiver IC 742, the third photodiode (PD3) 751 and its receiver IC 752, trans-impedance amplifiers (TIAs) (not shown in the figure), RF circuits (not shown in the figure), and other optoelectronic devices are attached to transmission lines 110x via connecting pillars like the solder bumps, regardless if the transmission lines are lines on surface or engraved as metal-in-trench structures on the second surface of the SOI substrate. Other optoelectronic devices may also be assembled on a PCB unit or a flexible circuit board (FCB) packaged to wafer surface. Directly patterning transmission lines on the surface enables high speed performance. The photodiodes are silicon detectors or a hybrid type of silicon and germanium detectors.

Another packaging technique is to attach adhesion film on the surface over the transmission lines 110x and interconnecting pillars 142x and 143x to passivate and insulate them from the later assembled active devices. External components can be attached to the adhesion film or the NCF film. Additional techniques to insulate them include applying a non-conductive film (NCF), over the top surface followed by heating to enhance adhesion of the attached parts. A cleaning process can be applied to expose the bonding pillars in order to properly connect to the active devices. The adhesion film or NCF is not shown in FIG. 7.

The above described active optoelectronics assembly including the electrical connections forms an optical engine. The optical engine is packaged to external circuits through bond pads on a flexible board like PCB or FCB 750.

Another option for interconnecting the transmission lines to active optoelectronic devices is through an optoelectronic packaging technique known as the anisotropic conductive film (ACF), not shown in FIG. 7.

ACF technology is widely used in optoelectronic packaging for higher signal densities and smaller overall packages. In this process, the anisotropic material, for example, a thermosetting resin containing conductive particles, is first deposited on the PCB 750 using a lamination process. The optical engine on the SOI substrate is then placed in position over the PCB and the two sides are pressed together to mount the optical engine to the PCB board. In many cases this mounting process is done with no heat or a minimal amount of heat that is just sufficient to cause the anisotropic material to become slightly tacky. In using a thermosetting resin containing conductive particles, the particles are trapped between the PCB and the optoelectronics elements, thereby creating an electrical connection there between. In other locations where it is not terminated with electrodes, particles are insulated by the thermosetting resin. For bonding, the amount of thermal energy required is higher due to the need to first flow the adhesive and allow the two sides to come together into electrical contact, and then to cure the adhesive and create a lasting reliable bond. The temperatures, times, and pressure required for these processes must be controlled properly.

First the optical devices, such as inputting optical fiber 621, photodetectors (PD) 731, 741, 751 and the receiver chips or trans-impedance-amplifier (TIA) arrays, are flip chip assembled to the bonding pillars 142x, 143x on the insulating film 129c of the SOI substrate 140 to form the optical engine. The high speed transmission lines 110x are therefore designed on the surface 129c to connect driver ICs to photodetectors 731, 741 and 751, as well as to connect the receiver chip TIA arrays and other electrical lines. In accordance with the embodiments, formation of the transmission lines 110x on the substrate may lead to improved RF signals performance due to the high dielectric characters of the silicon material, typically in range of 3.0-4.0 for infrared light. Thus formed optical engine can be operated at data rate of 25 Giga-bits per second (Gbps) per channel, and can be extended to higher data rates such as 50 Gbps per channel.

In some cases, the optical engine is assembled with a flexible printed circuit board (FCB). In an embodiment, the optical engine is assembled within a periphery of an opening in the PCB board. While not separately illustrated, such a configuration is compatible with other embodiments, including that described with regard to FIG. 7.

FIG. 8 illustrates a schematic optical paths of the disclosed WDM optical interconnect module, which has one fiber input and three WDM output optical ports on the SOI substrate, in accordance with an embodiment of the disclosure.

In FIG. 8, light input from fiber 621 is aligned to match the first 45 degree reflector 125a through the SOI substrate along path 823a, the first end reflector 125a bends light by 90 degree by total internal reflection and couples light to the first straight portion 224a of waveguides 122. Only light at first wavelength $\lambda 1$ is reflected as beam 823b by the first micro-reflector 228a to travel through the SOI substrate and arrive at the first photodetector PD1 731. The amount of the reflected light 823b is the fraction of the total beam that is reflected by the narrow band coated ($\lambda 1$) first reflector surface 228a. Coating efficiency of reflecting $\lambda 1$ but anti-reflecting other wavelengths of the first micro-reflector sitting in the beam path decides the fraction to be reflected. The remaining light beam containing $\lambda 2$ and $\lambda 3$ and possibly other wavelengths is then filtered by the rear reflector 228b which has anti-reflecting coating at $\lambda 2$ and $\lambda 3$. So inside the second straight portion 224b of the waveguide only $\lambda 2$ and $\lambda 3$ continue to travel. The second front micro-reflector 229a, which is narrow band coated to reflect $\lambda 2$ and transmit $\lambda 3$ reflects a second fraction of the beam that hits the reflector surface into the silicon substrate, this second fraction of light 823c arrives at the second photodetector PD2 741. The amount of the reflected light 823c is the fraction of $\lambda 1$ light within the incoming beam that hits the reflector surface 229a. The rear reflector 229b is anti-reflective coated to pass $\lambda 3$ at least. This arrangement allows the remaining beam containing $\lambda 3$ continue its travel in the third straight portion 224c of the waveguide 122. The remaining traveling beam in the third straight portion 224c is reflected by the second 45 degree end reflector 125b, which is narrow band coated to reflect at $\lambda 3$, into the silicon substrate as the third multiplexed beam 823d, which arrives at the third photodetector PD3 751. Light gets divergent in travelling. Typically the end reflector 125b has a reflective surface larger than the previous splitter reflector, in order to collect all the passing light before selective reflecting of $\lambda 3$ light. The WDM coupler completes the full optical path from the fiber input port 621 to the three WDM output receiver ports PD1, PD2 and PD3 as shown in FIG. 8.

This WDM multiplexing process can continue to more splitting stages with similar splitters coated to reflect more wavelengths $\lambda i$. The advantage of this 1×M output ports is obvious, first in that the transceiver and receiver are all kept on one side of the SOI substrate in a compact configuration for on-chip optical interconnect applications. Second, there will be no separate bonding step to integrate the waveguide.

FIG. 9 is a schematic flow chart illustrating a method for fabricating the WDM optical interconnect module in accordance with an embodiment of the disclosure.

The examplenary fabrication method proposes to make the passive waveguide side first and active device side afterwards. The reverse process is also possible by interchanging the sub-processes disclosed below.

The fabrication sequence may include the first step 902: provide a SOI substrate having a Si surface for optoelectronics and a Si-on-insulator surface (also known as device surface) for waveguides. The two surfaces may be parallel or slightly wedged to each other to avoid problems caused by ghost reflections. In step 904, pattern strip-like waveguides on Si-on-insulator surface and expose the oxide surface under the silicon layer. In step 906, pattern 45 degree reflectors at two ends of each silicon waveguide. In step 908, pattern sequentially arranged 45 degree splitter reflectors along silicon waveguide. In step 910, arrange to sequentially coat the reflectors with narrow band high reflective coatings at $\lambda i$ (i=1, 2, 3, . . . ).

In step 912, align the reflectors sequentially to WDM receivers. In step 914, turn substrate over to work on optoelectronics on the other Si surface. In step 916, deposit an insulating layer on the silicon substrate surface. In step 918, pattern trenches on insulating layer on Si surface and fill in metal to form transmission lines. Or deposit metal layer and pattern it to form transmission lines, with etching or laser writing get lines, followed by CMP to clean off the extra metal. The metal layer may be aluminum, tungsten, stainless steel, etc. If it is copper, process will need to follow copper plating techniques. In step 920, grow bonding pillars or solder bumps for flip chip mounting. There is often coating of gold or nickel on the bonding bumps.

In step 922, assemble a fiber input and multiple receiver device chips to the pillars/transmission lines and align them with 45 degree WDM reflectors.

FIG. 10 illustrates a schematic WDM optical interconnect module, which has one laser input and three WDM output optical ports on the SOI substrate, in accordance with another embodiment of the disclosure. FIG. 10 is different from FIG. 8 in that, the optical input source is provided by an active broadband laser diode 721, powered by its driver IC 722. Laser diode 721 emits multiple wavelength $\lambda i$ (i=1, 2, 3).

However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical WDM (wavelength division multiplexing) interconnect apparatus comprising:
a substrate having a first silicon surface and a second silicon surface substantially parallel to each other, wherein an oxide layer is embedded under the first silicon surface, and wherein an insulating layer is disposed on the second silicon surface;
an input optical source carrying a plurality of wavelengths disposed on the second silicon surface;
a first, a second, and a third output optical receivers arranged on the second silicon surface to receive a first, a second and a third of the plurality of wavelengths respectively; and
a silicon waveguide device disposed on the first silicon surface, comprising:
a first end reflector and a second end reflector on the silicon waveguide;
a first trench and a second trench each having a 45-degree first surface facing the first end reflector; and
a first and a second WDM reflectors sequentially arranged between the first and the second end reflectors along the silicon waveguide device,
wherein the first end reflector is broadband coated to reflect the plurality of wavelengths from the input optical source, wherein the first, the second sequentially arranged WDM reflectors and the second end reflector each is narrow band coated to reflect the first, the second and the third wavelengths;
wherein the first end reflector is aligned to the input optical source, wherein the first and second sequentially arranged WDM reflectors and the second end reflector each is sequentially aligned to the first, the second, and the third output optical receivers; and
wherein the first and second sequentially arranged WDM reflectors each is formed on the 45-degree first surface of the first and second trench facing the first end reflector respectively.

2. The optical WDM interconnect apparatus of claim 1, wherein the first and the second sequentially arranged WDM reflectors and the second end reflector each comprises 45 degree micro-reflectors.

3. The optical WDM interconnect apparatus of claim 1, wherein the silicon waveguide device is fabricated in (100) silicon crystal facet of the first silicon surface, and the micro-reflectors are formed on (110) crystal facet.

4. The optical WDM interconnect apparatus of claim 1, wherein a layer of oxide is grown on the silicon waveguide device to form a cladding structure.

5. The optical WDM interconnect apparatus of claim 1, wherein the input optical source is a fiber.

6. The optical WDM interconnect apparatus of claim 1, wherein the input optical source is a broadband vertical cavity surface emission laser (VCSEL).

7. The optical WDM interconnect apparatus of claim 1, wherein the plurality of output optical receivers comprises photodiodes (PDs), wherein the photodiodes are silicon diodes or a hybrid type of silicon and germanium diodes.

8. The optical WDM interconnect apparatus of claim 1, wherein the silicon waveguide device further comprises a rear reflector behind each of the plurality of sequentially arranged WDM reflectors, wherein the rear reflector is coated with an anti-reflective coating to transmit light passing said sequentially arranged WDM reflector.

9. The optical WDM interconnect apparatus of claim 1, wherein the substrate has a thickness ranging from 50 microns to 2 mm.

10. The optical WDM interconnect apparatus of claim 1, wherein the substrate is a SOI wafer.

11. The optical WDM interconnect apparatus of claim 8, wherein the rear reflector is a 45 degree micro-reflector.

12. The optical WDM interconnect apparatus of claim 8, wherein the rear reflector is perpendicular to the silicon waveguide.

13. The optical WDM interconnect apparatus of claim 1, wherein the plurality of sequentially arranged WDM reflectors each has a surface embedded in the silicon waveguide.

14. The optical WDM interconnect apparatus of claim 1, wherein the silicon waveguide further comprises a plurality of conductive lines disposed on the insulating layer on the second silicon surface.

15. The optical WDM interconnect apparatus of claim 14, wherein the plurality of conductive lines comprises tungsten (W), aluminum (Al), copper (Cu), gold (Au), silver (Ag), stainless steel, or an alloy.

16. The optical WDM interconnect apparatus of claim 1, wherein the plurality of conductive lines are high speed RF transmission lines capable of operating at 25 Gbps per channel.

17. A method of fabricating an optical WDM (wavelength division multiplexing) interconnect apparatus, comprising:
providing a substrate having a first silicon surface and a second silicon surface, wherein the first silicon surface is on an embedded oxide layer;
patterning a strip-like waveguide on the first silicon surface;
patterning a first and a second 45 degree end reflectors at ends of the silicon waveguide respectively;
forming trenches on the silicon waveguide between the first and the second 45 degree end reflectors, wherein each trench has a 45 degree front surface facing the first 45 degree end reflector;
patterning a plurality of sequentially arranged WDM reflectors each on the front surface of one of the trenches;
coating the sequentially arranged WDM reflectors with narrow band high reflective coatings at a plurality of wavelengths ki (i=1, 2, 3, . . . ) respectively;
turning the substrate over to work on the second silicon surface;
depositing an insulating layer on the second silicon surface;
patterning conductive lines and solder bumps in the insulating layer on the second silicon surface;
assembling a fiber input light source and the plurality of optical receivers on the solder bumps, wherein the fiber input light source comprises the plurality of wavelengths ki (i=1, 2, 3, . . . ) and wherein the plurality of optical receivers receives the plurality of wavelengths ki (i=1, 2, 3, . . . ) respectively;
and
aligning the two 45 degree end reflectors and said WDM reflectors sequentially to the fiber input light source and the plurality of optical receivers.

18. The method of fabricating an optical WDM interconnect apparatus in claim 17, wherein patterning the conductive lines comprises forming trenches and filling in metal in the trenches, followed by removing excess metal by polishing (CMP) or by selective etch to clean up metal outside the trenches.

19. The method of fabricating an optical WDM interconnect apparatus in claim 17 wherein patterning the conductive lines comprises depositing a metal layer, patterning the metal layer into lines, followed by removing excess metal by polishing (CMP) or by selective etch.

20. The method of fabricating an optical WDM interconnect apparatus in claim 17, further comprising patterning a rear reflector behind each of the plurality of sequentially arranged WDM reflectors; and coating the rear reflector with anti-reflective coating to transmit wavelengths passing said sequentially arranged WDM reflectors.

\* \* \* \* \*